United States Patent [19]

Schoeff

[11] 4,056,740
[45] Nov. 1, 1977

[54] DIFFERENTIAL INPUT-DIFFERENTIAL OUTPUT TRANSISTOR SWITCHING CELL

[75] Inventor: John A. Schoeff, Los Gatos, Calif.
[73] Assignee: Precision Monolithics, Inc., Santa Clara, Calif.
[21] Appl. No.: 646,902
[22] Filed: Jan. 6, 1976
[51] Int. Cl.² .................. H03K 5/20; H03K 17/60
[52] U.S. Cl. .................. 307/362; 307/DIG. 3; 307/255; 307/350
[58] Field of Search ............ 307/DIG. 3, 254, 235 R, 307/235 T, 270, 255; 330/30 R, 30D

[56] References Cited

U.S. PATENT DOCUMENTS

| 3,546,484 | 12/1970 | Fowler et al. | 307/270 |
| 3,755,693 | 8/1973 | Lee | 307/270 |
| 3,783,400 | 1/1974 | Gay | 330/30 D |
| 3,947,778 | 3/1976 | Hsiao et al. | 330/30 D |

*Primary Examiner*—Stanley D. Miller, Jr.

[57] ABSTRACT

A symmetric, two-branched transistor switching circuit is disclosed wherein steering current is fed to a node between the two branches. A logic input signal controls the electrical balance between the two branches controlling the flow of steering current from one branch to the other and back, depending upon two discrete logic input levels. The two-branched circuit is connected to a pair of loads, one associated with each circuit branch as well as to a common node which may be connected to an auxiliary circuit. By a balanced circuit configuration and supplying properly regulated bias during a logic input transition, the effects of parasitic capacitance, which normally delays switching times, may be reduced, thereby permitting the switching of very low levels of current, i.e. on the order of 1 or 2 microamperes at speeds comparable to those obtained when switching 1 or 2 ma. An auxiliary circuit which may be connected to the common node of the circuit is an electrical ladder which decrements current. A balanced output is provided in a pair of output lines for supplying an output current $I_{OUT}$ and its complement $\overline{I_{OUT}}$.

7 Claims, 8 Drawing Figures

DIFFERENTIAL INPUT-DIFFERENTIAL OUTPUT TRANSISTOR SWITCHING CELL

BACKGROUND OF THE INVENTION a. Field of the Invention

The invention relates to high speed transistor switching circuits, and more particularly to a high speed transistor switching circuit for use in switching very low currents of the type found in integrated circuit digital to analog converters and the like.

b. Prior Art

High speed transistor switching circuits for switching low levels of current have many applications, one of which is in the field of digital to analog converters. In such converters, it is desirable to produce an analog output from a digitally coded signal. Such a digitally coded signal usually appears as a digital word formed by a number of "bits", which are typically one's and zero's. Digital to analog converters (DAC) for achieving this are well-known in the prior art, and the theory of operation for such circuits, hereafter referred to as DACs, are described in the book "Analog Integrated Circuit Design", by A. B. Grebene, Van Nostrand, 1972, p. 328-350, incorporated by reference herein.

In the above-mentioned book, the author points out that the transfer function of a DAC can be written as follows:

$$A = P[b_1 2^{-1} + b_2 2^{-2} + \ldots + b_N 2^{-N}]$$

The implementation of the DAC contains four separate parts including a reference signal corresponding to the parameter P in the above equation; a set of binary switches to simulate the binary coefficients, $b_1, b_2, \ldots b_n$; a resistive weighting network which provides the factors $2^{-1}$ through $2^{-N}$, and an output summing line for forming the output of the apparatus, A.

Figure 1:
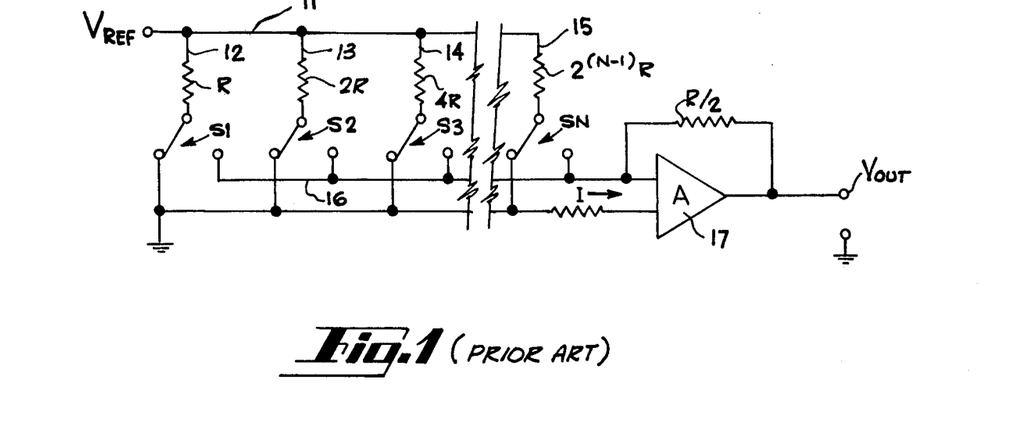
FIG. 1 is a simplified plan view showing use of switches for handling currents, including low level currents in the least significant bit in a digital to analog converter.

A simplified apparatus for carrying out a DAC system is shown in FIG. 1 of the drawings. In FIG. 1, a series of resistors serve to decrement a reference current supplied by the reference source, $V_{REF}$, as such current is available along line 11. In FIG. 1, the decrementing resistors are labeled R, 2R, 4R, ... $2^{(N-1)}$R. Thus, twice as much current flows through branch 12 than branch 13. Twice as much current flows through branch 13 as flows through branch 14 and so on. Of course, current will flow toward the output terminal O, in line 16, only if a respective current switch is moved to its non-grounded position, opposite that shown in the figure.

To limit the spread in the value of resistors, networks have been devised which limit the spread of resistor values, yet achieve binary weighting of currents. One such network is known as a R-2R ladder network, discussed in the above mentioned book. An improved electrical ladder network is the subject of my copending patent application entitled "Multi-Stage Electrical Ladder for Decrementing a Signal Into a Plurality of Weighted Signals", Ser. No. 642,770, filed Dec. 22, 1975.

The switches S1, S2, S3, . . . SN are usually high speed current switches. Such switches of the prior art may be seen in U.S. Pat. Nos. 3,747,088 and 3,842,412.

Figure 2:
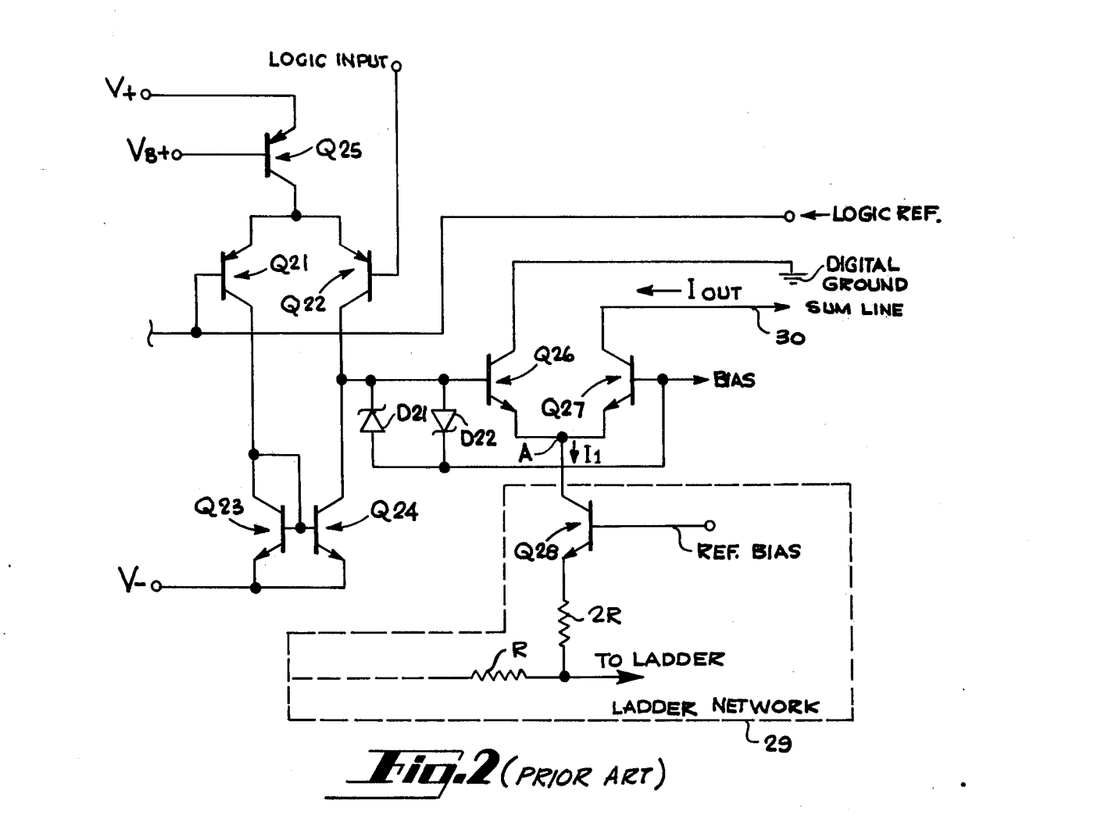
FIG. 2 is an electrical schematic of a prior art transistor switching circuit.
Figure 3:
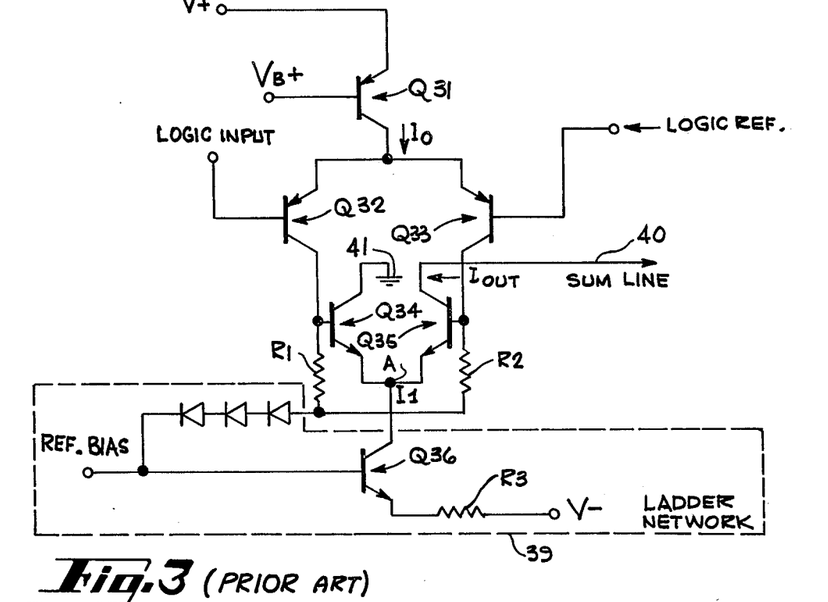
FIG. 3 is another electrical schematic of a prior art transistor switching current intended for use in digital to analog converters.

A more advanced prior art switch is shown in FIGS. 2 and 3 of the drawings.

FIG. 1 of the drawings shows switches S1, S2, S3, SN for use in a simplified digital to analog converter where input currents supplied along line 11 by the source of $V_{REF}$ is decremented in lines 12, 13, 14, 15 by the respective resistors R, 2R, 4R, $2^{(N-1)}$R. Digital input signals are supplied to the switches S1, S2, S3, SN and determine the position of the switches for forming an analog signal which is supplied to the amplifier 17 and then to the output O.

FIG. 2 shows a prior art circuit which was described in an article entitled "A Complete Monolithic 10-$b$ D/A Converter" by D. Dooley, appearing in IEEE Journal of Solid State Circuits, December 1973. In the circuit of FIG. 2, the transistors Q21, Q22, Q23, Q24, Q26 and Q27 form an emitter coupled logic gate which is Schottky clamped by the Schottky diodes D21, D22 for directing steering current between circuit branches wherein the transistors Q26, Q27 are situated. The transistors Q26, Q27 supply steering current to a mutually connected node A which is pulled by the current source 28 which is part of a ladder network indicated by the dashed line 29. Resistors R and 2R form extensions and rungs, respectively, of such a ladder network, for example of the R-2R type discussed in the book by Grebene, supra, p. 333.

Transistors Q26 and Q27 draw current from two different locations. Q26 draws current from digital ground, while Q27 draws current from a sum line 30. Thus, the current pulled by transistor Q28 from node A comes either from ground or from the output summing line 30, depending on the logic input signal which controls the balance of the network formed by transistors Q21, Q22, Q23, Q24.

Another prior art circuit having the same use as the circuit of FIG. 2, is shown in FIG. 3. In this circuit, a two-branched input is formed by the input transistors Q32, Q33. The input to transistor Q32 is a logic input signal which controls the balance of flow of current from the transistor Q31. The input to transistor Q33 is a logic reference signal which sets the threshold at which the circuit becomes unbalanced, allowing a logic input signal to change the balance of current flow from one branch of the circuit to the other. Current is thereby steered between the transistors Q34 and Q35, pulling current either from the sum line 40 or from digital ground 41. Transistors Q34, Q35 have emitters connected to the common node A' which supplies current pulled by transistor Q36, a current source within the ladder network indicated by the dashed line 39. The resistor R3, connected to transistor Q36 is a resistor in the ladder network and may be one of the resistors in an R-2R network. A more detailed description of the operation of the circuit of FIG. 3 is contained in a paper entitled "An Integrated Circuit 12-Bit D/A Converter" by Robert B. Craven, published in the 1975 IEEE International Solid-State Circuits Conference, Feb. 12, 1975, p. 40. Another well known circuit of the prior art is an integrated circuit known as Motorola MC1508 which is described in a data sheet published by Motorola, Inc., Phoenix, Arizona.

One of the problems present in prior art circuits is that only a single ended output is available, usually the sum line 30 as in FIG. 2 or the sum line 40, as in FIG. 3. In many applications there is a need not only for a summing current, $I_{OUT}$, but for a complementary current, $\overline{I_{OUT}}$. Moreover, prior art switches are not able to switch very low current levels at high speed because of the need to charge parasitic capacitance and the influence of transient signals within the circuit. Another problem with circuits of the prior art is that output compliance is not possible and that logic thresholds are not fully adjustable.

It is therefore an object of the invention to devise a high speed, low current switching circuit with complementary true current outputs, i.e. high impedance outputs, and having high output voltage compliance, with an adjustable logic threshold. Such voltage compliance should be wide enough to allow output levels which may swing above the positive power supply.

SUMMARY OF THE INVENTION

The above objects are achieved with a differential input, differential output current cell which comprises a balanced two-branch input means for receiving a digital logic signal and switching steering current alternately between the two branches in response to a logic input signal in a balanced two-branch output means connected to the input means for communicating with a load associated with each branch in response to steering current in one of the branches.

The input means includes a pair of matched level shifting transistors arranged symmetrically in opposite left and right branches with a common electrode of each transistor joined to the first node which in turn is connected to a first bias circuit for supplying closely regulated switch current. The first bias supply includes an integrating amplifier for absorbing current spikes.

The level shifting transistors further include a control electrode communicating with one of the left and right circuit branches for changing the electrical balance therebetween. A corresponding electrode in the other circuit branch is connected to a second bias circuit means for generating a constant voltage at a low impedance level which serves as a fully adjustable threshold voltage for the signal applied to the control electrode.

A pair of matched output transistors is arranged symmetrically for connection to opposite left and right circuit branches at the outputs of the level shifting transistors. Each of the output transistors has a common electrode joined at a second node which is in turn connected to deliver steering current to an external circuit, such as to a transistor current source for an electrical ladder. A third bias circuit means is connected to voltage dropping resistors in the base circuits of each of the output transistors. The bias circuit means helps preserve the electrical balance between branches by absorbing transients which would lower switching speed. A Class A constant current stage, with high frequency response, adequately forms such coupling of transients to AC ground.

The circuit which is connected to the common emitters of the steering transistor pair of the high speed switch may be a conventional R-2R ladder or a newly provided master-slave electrical ladder which is the subject of my co-pending patent application Ser. No. 642,770. In that application, a master ladder has an input reference signal and a plurality of scaling devices as well as connected transistor switches. The master ladder receives the input current and divides it into a plurality of decrementally weighted signals. The master ladder includes a terminating device for generating a remainder signal, left over after providing decrementally weighted signals.

A first slave ladder includes a plurality of second signal scaling devices, each having an associated current output line. The slave ladder receives the remainder from the master ladder and divides it into a plurality of weighted signals in the output lines. A second terminating device generates a second remainder signal, left over after the first remainder signal is decremented in the slave ladder.

The scaling means of either ladder may be an R-2R resistor ladder in combination with sourced transistors.

DESCRIPTION OF THE PREFERRED EMBODIMENT

FIGS. 1, 2 and 3, describing prior art circuits have been discussed above. The apparatus of the present invention is described with reference to FIG. 4 which generally shows the switching transistors of the present differential input, differential output current cell between the dashed lines 41 and 43. The first bias circuit of the present invention is situated between dashed lines 43 and 45 and above the dashed line 47. The second bias circuit means of the present invention is to the right of dashed line 45 and below dashed line 47. The third bias circuit means of the present invention is generally to the left of dashed line 41, while the current source and resistor associated with a resistor ladder or other associated circuit for which the high speed switching cell of the present invention is utilized, exists between dashed lines 41 and 43, but below dashed line 49.

Figure 4:
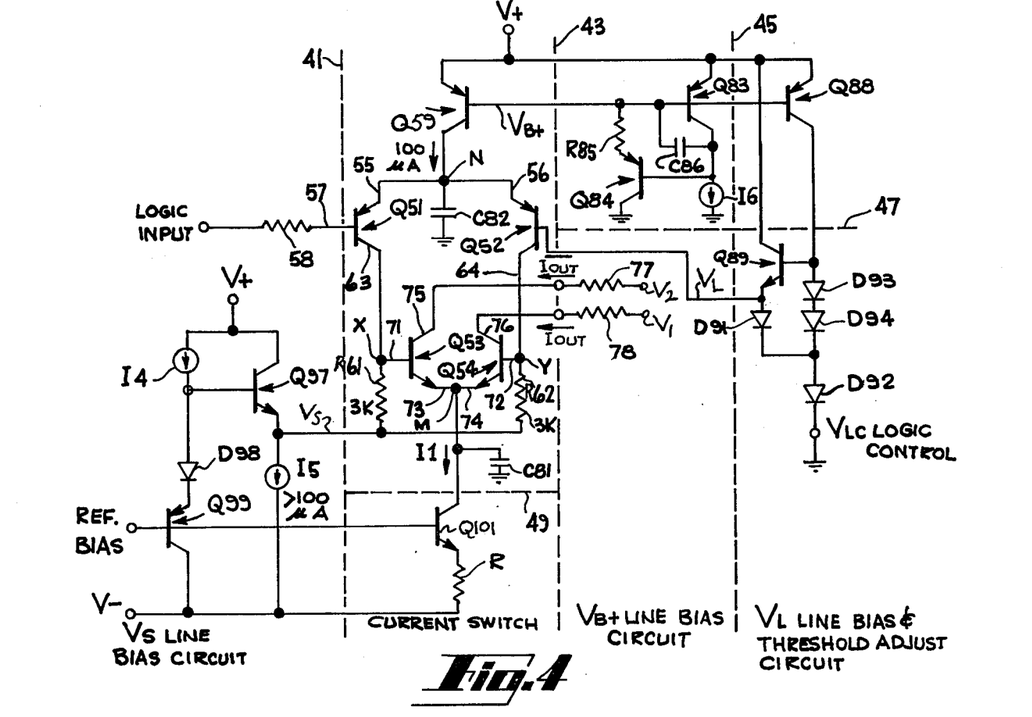
FIG. 4 is an electrical schematic of a differential input, differential output current cell for low current level, high speed operation, with complementary true current outputs.

The current switch existing between dashed lines 41 and 43 is seen to include a pair of matched level switching transistors Q51 and Q52 arranged symmetrically in left and right hand circuit branches, respectively. The level switching transistors Q51 and Q52 have emitter electrodes 55, 56 respectively which are connected to a first node N. The level shifting transistor Q51 has a control electrode 57 which is connected to receive a logic input signal through resistor 58. The input signal typically has two discrete states including a low state for turning on transistor Q51 and turning off transistor Q52. Current supplied by the current source transistor Q59, termed switch current, is supplied to the load resistor R61 when transistor Q51 is turned on. This current is transmitted to resistor R61 through an output electrode 63 of level shifting transistor Q51. A similar resistor, R62, is connected to the output electrode 64 of the level shifting transistor Q52.

A pair of matched output transistors Q53, Q54 are arranged for symmetrical connection to opposite left and right circuit branches. A control electrode, 71, 72, is connected to the respective circuit branch for receiving control voltages from the resistors R61 and R62.

Each of the transistors Q53, Q54, has a respective common electrode 73, 74 respectively joined at a second node M. Each of the output transistors Q53, Q54 has an output electrode 75, 76 respectively connected to a load 77, 78 communicating directly therewith. Load 77, 78 is terminated in voltages V1, V2 which may be supplied by external circuits. The voltage dropping resistors R61, R62 in respective left and right circuit branches of the apparatus are connected through respective control electrodes 71, 72 to the transistors Q53, Q54.

When a logic input signal turns on transistor Q51, switch current supplied by transistor Q59 is directed to the left hand circuit branch through resistor R61. The voltage drop in the voltage dropping resistor R61 turns on transistor Q53 and turns off transistor Q54 since the voltage drop across resistor R62 is zero.

A high logic input steers steering current through transistor Q52 and activates transistor Q54 thereby pulling current through the resistor load 78 corresponding to a positive "true", or positive "enable", logic operation. Thus, the switch is capable of either positive or negative "true" logic operation, merely by selecting the proper switch output. It is important that the resistors R61 and R62 be matched and are shown to be of equal value at 3,000 ohms each. Similarly, transistors Q53, Q54 are matched, especially with respect to having the same emitter area for carrying the same current therethrough. The matching of transistors Q53 and Q54 and resistors R61 and R62 means that the parasitic capacitance C81 does not need to be charged or discharged to accomplish switching in either direction thereby permitting higher speed.

A unique advantage of the current cell of the present invention is that it may be tailored for the best transient performance by minimizing the value of resistors R61 and R62, thereby minimizing the voltage swing and sensitivity to logic feedback at the bases of transistors Q53 and Q54. The criteria for selecting the value of resistors R61 and R62 is the maximum amount of off-state current which the current switch will tolerate for a given error allocation based upon the value of the steering current and the application of the switching cell.

Transistor switches of the prior art have been limited by parasitic capacitor discharge time, and by positive transients which are coupled into node M, as well as by the frequency response of the transistors themselves. The high speed switching of the present invention is achieved by means of the first, second and third bias circuit means described herein.

The first bias circuit means of the present invention is applied to the base of transistor Q59 on the line designated $V_{B+}$. If this line were unable to absorb current spikes fed through the collector-base capacitance of Q59 due to the switching of transistors Q51 and Q52 the transients would adversely affect settling time of the overall circuit by modulating the switch current of all switches connected to the same bias line.

Isolation of the first bias circuit which supplies switch current is achieved by providing an integrating amplifier formed by transistors Q83 and Q84. Transistor Q83 sets the supply level of $V_{B+}$ at a level a diode drop below V+ and a network formed by the capacitor C86 and resistor R85 serve to absorb current shocks along the $V_{B+}$ line. R85 and C86 will damp ringing and oscillations on the line. Transistor Q84 provides feedback to transistor Q83, thereby providing stability to the $V_{B+}$ supply. The voltage gain of transistor Q83, typically 4000, effectively multiplies the value of C86 applied to the $V_{B+}$ line. If C86 has a value of 10 pf., the feedback capacitance to $V_{B+}$ is effectively 40,000 pf. The stability of the $V_{B+}$ line is thus such that the same line may supply a plurality of switching circuits and hence the switching circuit of the present invention is termed a cell since a plurality of cells may share a common $V_{B+}$ supply. It will be noted that a current sink 16 pulls on the collector of Q83 and the base of Q84, setting the value of current in Q83, Q59 and Q88.

A second bias circuit means exists to the right of dashed line 45 and below line 47. This bias means supplies the line $V_L$ whose function it is to maintain steady voltage as a logic threshold voltage defining the threshold between high and low logic states. For example, for transistor-transistor logic, TTL, the threshold is 1.4 volts. Current flowing from the collector of Q88 is fed to the base of transistor Q89 and then to ground through diodes D93, D94 and D92. Q89 and D91 also turn on and a current equal to the collector current of Q88 flows in the collector of Q89 and in D91. Q89 and diodes D91 and D92 provide a low impedance to ground such that the entire second bias circuit means is a low impedance bias circuit with high logic line regulation, operating in essentially a Class AB mode. Diodes D91, D92, D93, and D94 may be npn transistors with shorted collectors. The low impedance of the second bias circuit means allows excess base current which is ejected from the base of transistor Q52 to be accomodated during switching by sending it to ground through diodes D91 and D92. Diodes D91 and D92 will be required to sink the full value of the switch current when transistor Q52 first turns on, and as is mentioned previously, this could be happening in many parallel current cells of the same line.

Transistor Q89 sources current when transistor Q52 turns off since transistor Q51 pulls current through the base-emitter capacitance of Q52 and this would change the voltage in the bias line $V_L$ without the second bias circuit means. In other means, if the second bias circuit were not provided, the transistors Q51 and Q52 would change state at a slower rate. Other voltages applied to $V_{LC}$ will set thresholds in the range of $-10$ volts to $+12$ volts, so that true CMOS and ECL compatibility may be achieved.

The third bias circuit means of the present invention, and perhaps the most important, controls the bases of transistors Q53 and Q54 through resistors R61, R62, respectively and specifically sets the voltage levels at nodes X and Y respectively. The voltage level determined by the third bias circuit means is denominated $V_S$ which is set in the emitter of transistor Q97. The collector of transistor Q97 is connected to the positive supply V+ and its base is connected to the same source through a current source means 14. The third bias circuit means which provides the bias to line $V_S$ is a Class A constant current stage. This is a stage which is on at all times with a current sink I5 which is set to have a value equal to the sum of the currents coming from all switches connected to the $V_S$ line plus enough current to absorb all transients and keep transistor Q97 turned on at all times. This requires that transistor Q97 have a cutoff frequency of approximately 500 Mhz and an emitter dynamic impedance being low, approximately 26 ohms at D.C. and 36 ohms at 100 Mhz. The diode D98 and the transistor Q99 serve to reference the base of transistor Q97 to the reference bias line, with the base of Q99 being provided with a reference bias for keeping the transistor Q99 on. Reference bias is also provided to transistor Q101 which pulls current I1, available through node M from one of the loads, indicated by the appropriate logic input signal.

Operation of the transistor switching cell will be explained with reference to a low to high changing input signal, from 0.4 to 2.4 volts, typical for TTL logic, which signal appears at the logic input. If the rise time is short, transistor Q51 will turn off before node N reaches a voltage of $V_L + V_{BE}$ is the base-emitter drop of transistor Q52. This is the case because the base-emitter junction of Q51 will turn off and parasitic capacitance will delay the rise of node N. Transistor Q51 turns off typically less than 10 nonoseconds and node X begins a resistive-capacitance discharge towards bias voltage $V_S$. If resistor R61 is 3,000 ohms, as shown, and parasitic capacitance at node X is 2 pf, then the RC time constant for the left hand branch is 6 nanoseconds. Node N would charge from 1.1 to 2.1 volts which would require approximately 20 nanoseconds. The net result is that, if no other transients are involved, node X falls before node Y rises and thus node M is allowed to discharge toward V-. When node Y rises, Q54 turns on and pulls node M up to its proper operating voltage. The switch turn on propagation delay is therefore determined by the charging rate of node N, frequency response of transistor Q52, and the charging rate of node Y. A typical turn on delay is in the range of 30 to 35 nanoseconds for a wide range of current.

With reference to a high to low changing input signal transistor switching cell is much less dependent on node N. When transistor Q51 turns on, it pulls node N down and promptly turns off transistor Q52. Node Y falls and node X rises at very close to the same time, so that switching is fairly symmetrical. In optimum operation of the circuit, voltages on the lines $V_L$, $V_S$, and $V_{B+}$ are constant and no parasitic effects except the charging and discharging of nodes M, N, X and Y are involved.

If the $V_S$ line changes voltage level during switching, especially in the positive direction, the transistor switching cell of the present invention will not be useful at low current levels. A positive transient on the $V_S$ line will cause the bases of Q53 and Q54 to rise, and the transistor which is on will pull node M up by the peak value of the positive transient. When $V_S$ and the bases return to their proper level, node M will remain high and must be discharged by switch current. A 0.5 volt transient with steering current I1 at a level of 1 microampere and capacitance of the parasitic capacitor C81 at a level of 2 picofarads would cause a delay of 1,000 nanoseconds. A current level of 100 nanoamperes would have a propagation delay 10 times as great, and the advantage of the fully differential switching action would be lost.

There are several ways in which a transient may be coupled into the $V_S$ line, and a wideband, low impedance bias regulator must be used so that current spikes do not disturb $V_S$. Two forms of current spiking are caused by the switching action of transistors Q51 and Q52. With a low to high level logic input transition, Q51 turns off before Q52 turns on. This causes an interruption in the current which is delivered to the $V_S$ line, which can cause a transient at the turnoff of transistor Q51 and at the turnon of transistor Q52. A high to low transition at the logic input will cause extra current to appear at the collector of Q51, due to the fast discharge of parasitic capacitance at node N. If the $V_S$ is poorly regulated, this will cause a positive transient, which will be even more pronounced if several switches are operating simultaneously.

The high frequency response of transistor Q97 and the fact that a current sink, I5, is always pulling current from the emitter of Q97 allows transistor Q97 to remain on at some current level thereby stabilizing the $V_S$ line, making it less sensitive to transients. The suppression of transients on the $V_S$ line inhibits their coupling into node M through the transistors Q53 and Q54. All of the bias circuit means, the first, second and third, have as their object the stabilization of node M against transients.

Fast logic transitions can couple current spikes directly through the collector-base capacitance of transistor Q51 into node X, and then into node M. For example, a 0.4 to 2.4 volt input change in 5 nanoseconds, with a collector base capacitance in transistor Q51 of 0.5 picofarads, will cause a 200 microampere spike which is equivalent to 600 millivolts in a 3,000 ohm load resistor. This would cause a turnon delay of greater than 1 microsecond at a 1 microampere switch current. One way to reduce this spike is to filter the input signal, which may easily be accomplished by placing resistor 58 connected to the base of transistor Q51, so that the parasitic collector-base capacitance and the base-isolation capacitance will be charged and discharged slowly. The base resistance 58 of transistor Q51 may be as high as 10 K ohms since the switch input current is typically only 2 microamperes. Parasitic capacitance of 2 picofarads would yield of time constant of 20 nanoseconds.

Although not shown in the embodiment of FIG. 4, Schottky or standard diodes may be clamped across resistors R61 and R62 to reduce logic signal feedthrough to the bases of Q53, Q54.

Figure 5:
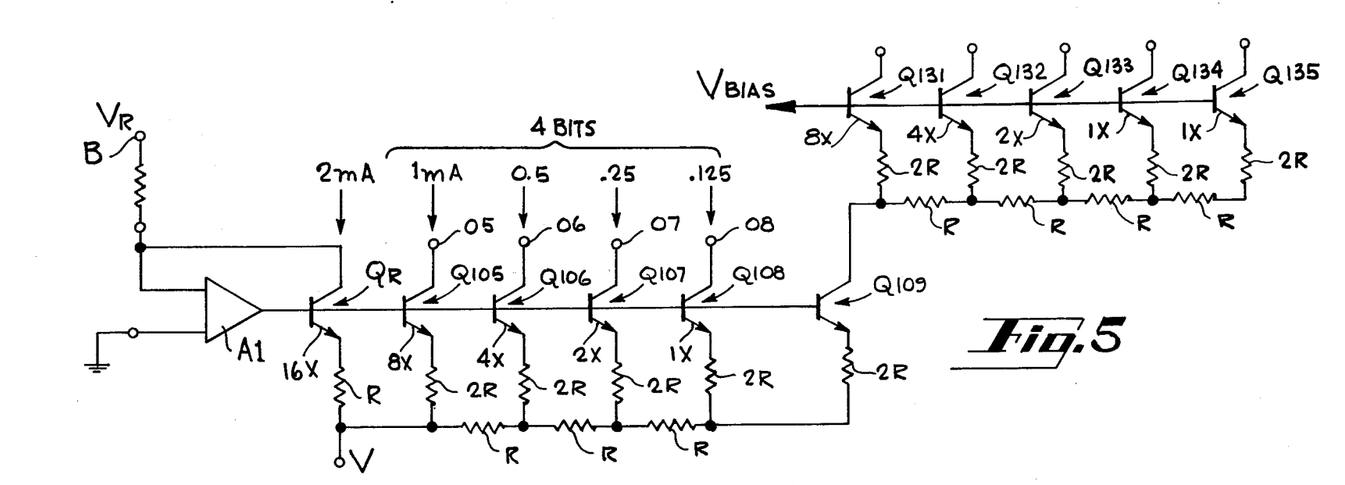
FIG. 5 is an electrical schematic of a masterslave ladder for decrementing current.

As mentioned previously, the transistor switching circuits of the present invention have diverse applications, including one application wherein very low levels of current are switched in digital to analog converters. Such converters are typically formed by the combination of such switches with a resistive ladder, indicated in FIG. 1. A preferred type of resistive ladder is described in my copending patent application Ser. No. 642,770 and such an electrical ladder may be combined with the switches herein for a preferred digital to analog converter. The preferred ladder, termed a master-slave ladder, utilizes the principle of scaled emitters for decrementing an input signal. FIG. 5 illustrates such scaling wherein the emitter of each transistor is tagged with a number indicating the scaling ratio, i.e. 16x, 8x, 4x, 2x, 1x. The master ladder, comprising the transistors QR, Q105, Q106, Q107, Q108 has scaled emitters which comprise a scaling means of the type known in the prior art. The master ladder comprising these transistors also includes an input reference signal generated from the input amplifier A1 which is typically an operational amplifier connected to a reference voltage, $V_R$, which supplies reference current to the master ladder outputs. The master ladder decrements the input signal into a plurality of weighted signals, one signal associated with each transistor of the ladder plus a terminating transistor for generating a remainder from the leftover signal.

Figure 6:
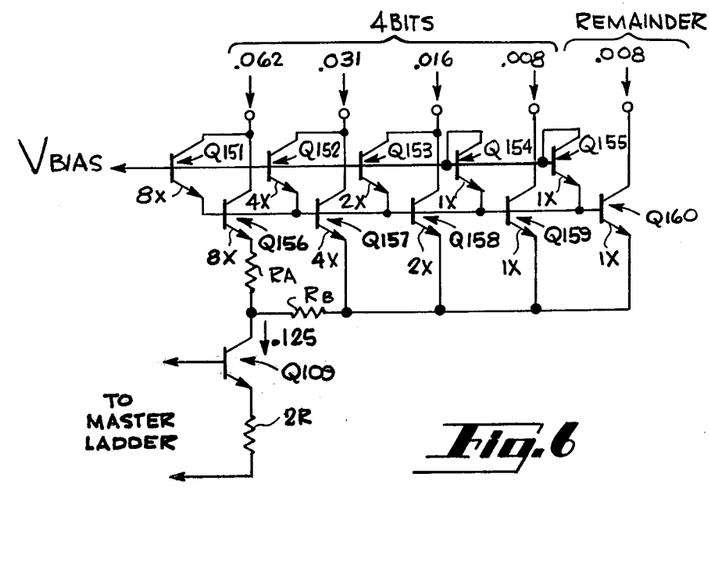
FIG. 6 is an electrical schematic of an improved slave ladder for use with a master ladder in decrementing current.

A slave ladder network is provided with a second signal signalling means which receives the remainder signal from the master ladder and divides it into a plurality of decrementally weighted signals which are delivered to the second outputs, associated with transistors Q131, Q132, Q133, Q134 and Q135. It is seen that the resistors in both the master and slave ladders are of the R-2R type, although such is not necessary. Instead, the remainder signal from transistor signal Q109 may be decremented as shown by the arrangement of transistors in FIG. 6. In FIG. 6 the master ladder, not shown, comprises an R-2R resistor network connected to the transistors Q105, Q106, Q107, Q108 and Q109 as in FIG. 3. A reference signal is applied to the input node B by the voltage $V_R$ which is fed to the operational amplifier A1 which in turn drives the reference transistor QR. Each of the transistors in the master ladder Q105-Q108 has a respective node 05-08 for outputting decrementally reduced current levels to the transistor switches previously described, with such current levels typically given by the values indicated on the figure, whereas the input current through the reference transistor QR may be of the order of 2 milliamps, the decremented current levels through Q105-Q108 are respectively 1 ma., 0.5 ma., 0.25 ma., 0.125 ma. and in the terminating transistor Q109 another 0.125 ma.

The slave ladder connected to the collector of transistor Q109 in FIG. 6 includes the transistors Q151, Q152, Q153, Q154, Q155 which divide the total base current of transistors Q156–Q160 and apply it in a scaled manner to the outputs of transistors Q156–Q160. Thus the effective current gain of transistors Q156–Q160 is multiplied by the current gain of the corresponding transistor in the series Q151–Q155 and the collector current error caused by the base currents of Q156–Q160 is reduced by a factor of $\beta$ of the compensating transistors Q151–Q155. The collector of transistor Q156 is connected to the collector of transistor Q151; the collector of transistor Q157 is connected to the collector of transistor Q152; and so on. The compensating transistors Q151–Q155 have base-emitter junctions scaled in the same proportion as the transistors of the slave ladder network Q156–Q160, to which it is connected. Thus, the base-emitter junctions of the transistors Q151–Q155 are scaled in an eight to one ratio as indicated in the figure, the same ratio as the emitters of Q156–Q160. By scaling in this manner, the transistor Q151 is able to provide proportionally a greater amount of feedback of base error current to the transistor Q156 which is contributing a proportionally larger share of the error current because of its scaled emitter.

In FIG. 6 the two resistors $R_A$ and $R_B$ are of equal value and large compared to the dynamic emitter resistance of transistors Q156 and Q157, serving to divide the remainder current from the transistor Q109 into equal parts. The reason that it is desired to split the current for terminating transistor Q109 into roughly equal parts is that is is known that approximately 50% of the error generated in the slave network Q156–Q160 is allocated to the transistor Q156. Since Q151 feeds back base current which should compensate for the base error current, the transistor Q156 contributes very little output error current. This is desirable because the output of transistor Q156 represents the most significant signal or bit with reference to the remaining transistors, since the most significant bit is defined as the one having the greater increment of current and the least significant bit is the one having the most decremented signal level. According to this scheme, half of the error budget is then allocated to the transistors Q157–Q160 and no further resistors are provided since the scaling provided in the transistors Q157–Q160 provides a good approximation for the manner in which the emitter current is to be allocated. In other words, allocation of current flowing through $R_B$ is exactly in proportion to the sum of the sizes of the base-emitter junction of the slave ladder transistors Q157–Q160. One of the reasons that further resistors are not provided for a more perfect allocation of the error signal budget is that in integrated circuit construction the cost of providing such resistance in terms of surface area of an integrated circuit chip is large and for the least significant bits of the slave ladder the error budget allocation made by scaled emitter transistors Q157–Q160 is adequate for yielding good accuracy. The transistor Q160 and its associated feedback transistor Q155 terminate the slave ladder by providing a terminating means which duplicates the least significant bit, transistor Q159 and its associated feedback transistor Q154.

The master-slave ladder implicit in FIG. 6 shows current outputs of the slave ladder to be 0.062 ma., 0.31 ma., 0.016 ma. and 0.008 ma. representing the least significant bits, whereas it is seen that a most significant bit in the master ladder portion of the apparatus is illustrated in FIG. 5 where 1 ma., 0.5 ma., 0.25 ma. and 0.125 ma. All of the transistors of the master-slave ladder are of the same type when the apparatus is constructed by means of integrated circuit construction. Moreover, since the scaling ratios are the same for the master and slave ladders, another processing benefit is achieved inasmuch as minimal scaling ratio is achieved for an electrical ladder having a large number of current outputs. In the slave ladder, note that the collector of transistor Q154 is connected to its base, thereby providing for faster switching of the current switching cell which is attached to the collector of Q159. This means that the collector of transistor Q159 receives no feedback current and that its output error current will be greater. However, since this is the least significant bit, the increased error current is sacrified for the advantage of being able to switch the current therein faster in the connected current switching cell.

Figure 7A:
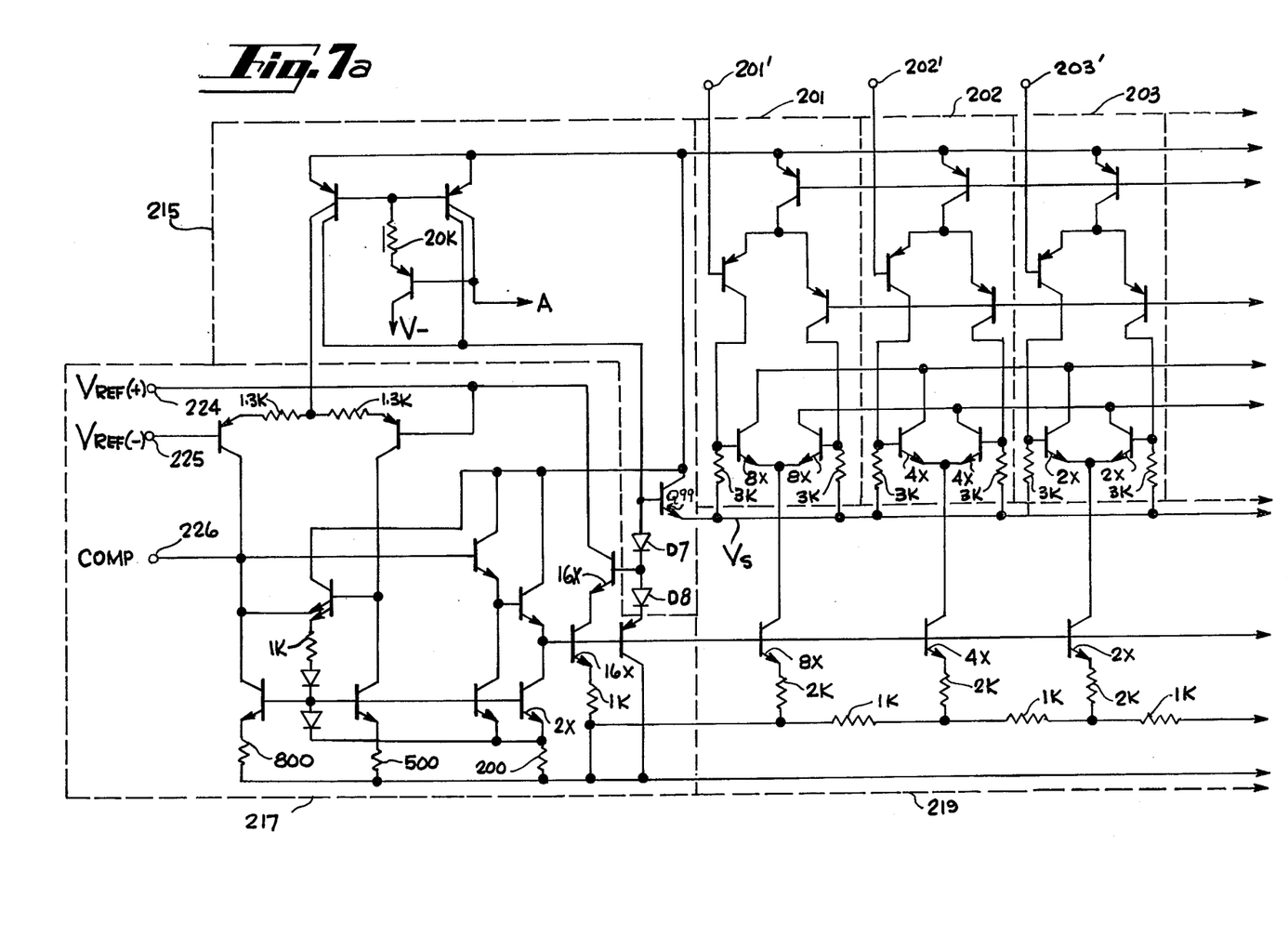
FIGS. 7a and 7b are an electrical schematic of a digital to analog converter utilizing a complementary current, fully differential input, differential output current cell in combination with an improved master-slave ladder for decrementing currents.
Figure 7B:
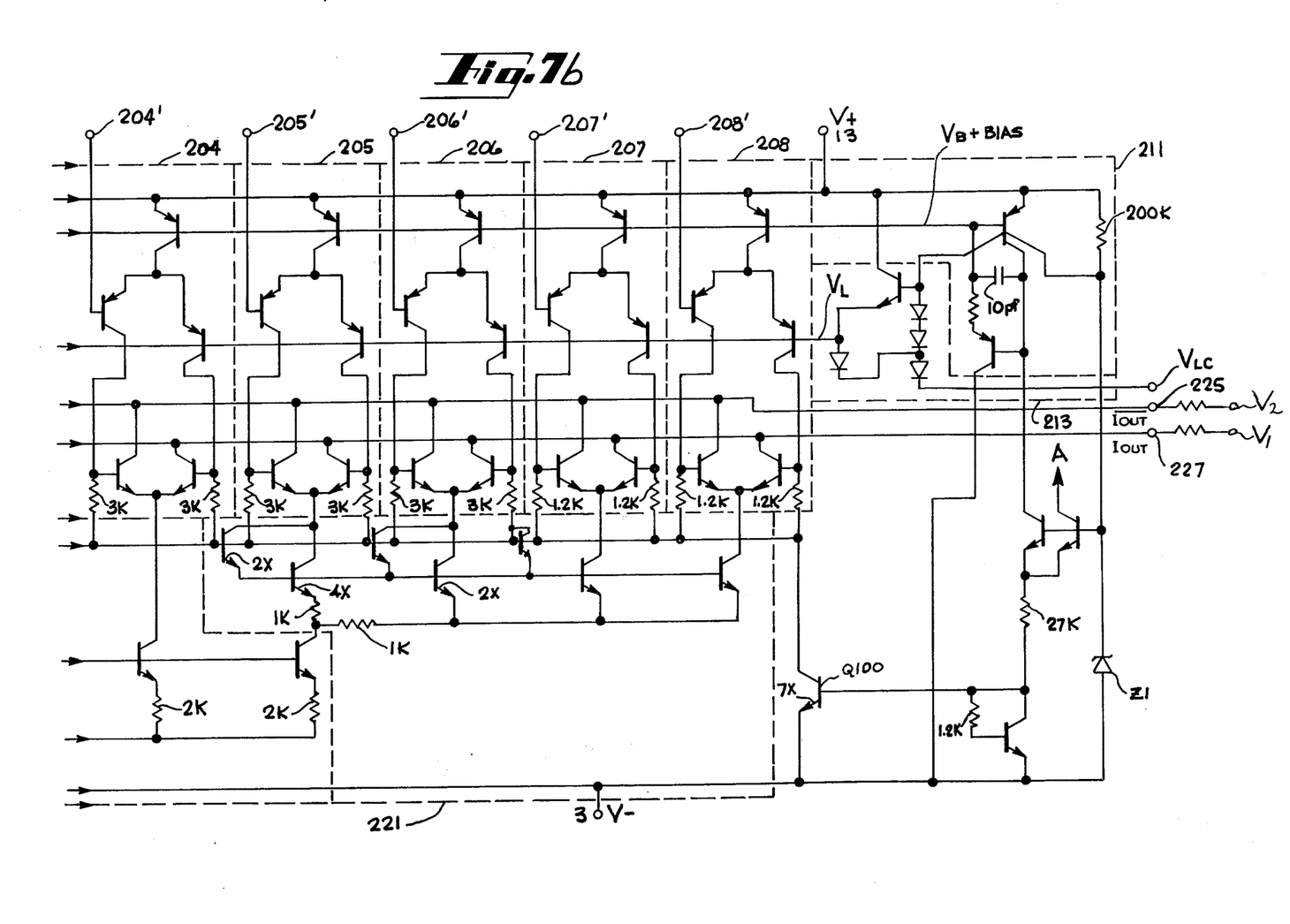

FIG. 7 shows a complete digital to analog converter using the current switching cells described herein, together with the improved master-slave ladder. The complete digital to analog converter includes differential input, differential output current cells 201, 202, 203, 204, 205, 206, 207 and 208. Each switching cell has a corresponding logic input 201', 202', 203', 204', 205', 206', 207' and 208' for applying, in parallel, a high or low logic signal corresponding to an eight bit digital word. Each corresponding current cell is switched in accord with the high or low nature of a corresponding bit of such a word in the manner previously described with reference to FIG. 4.

The first bias circuit means for providing the bias $V_{B+}$ is shown within the block identified by the dashed line 211.

The second bias circuit means for supplying the voltage $V_L$, previously described, is within the dashed line 213.

The third bias circuit means for providing the bias level $V_S$ is shown within the block defined by the dashed line 215. A portion of the third bias circuit means includes a pulldown current source transistor Q100 whose collector is connected to the line which carries all switch resistors and the emitter of Class A npn transistor Q99. The operational amplifier for providing an input reference signal is shown within the block defined by the dashed line 217. In actual use, a reference resistor is connected between a voltage reference $V_{REF}$ and node 224. A negative reference signal $V_{REF(-)}$ may be applied at node 225. The master ladder is shown within the block 219 with an R-2R network therein with resistors of value 2K and 1K.

A slave ladder is shown to be connected to the terminating transistor of the master ladder within the dashed line 221. This slave ladder is similar to the slave ladder illustrated with respect to FIG. 6.

It will be seen that the output of each of the transistors in the master ladder and slave ladder is connected to a corresponding common node of a switching cell. Each of the switching cells is connected to a respective common output load line 227, 228 for generating true high compliance current outputs, $I_{OUT}$ and its complement $\overline{I_{OUT}}$. Output load lines 227, 228 may terminate in voltages V1, V2, supplied by external circuits.

In summary the following advantages may be seen with reference to the transistor switching cell described above. First, the cell is shown to possess complementary outputs, $I_{OUT}$ and $\overline{I_{OUT}}$, for positive or negative logic, i.e. positive or negative logic is selected by selection of an appropriate one of the two complementary outputs. For example, for positive "true" logic operation the output in use would be enabled by a one in the input and for a negative "true" the appropriate output would be enabled by a zero at the input. A balanced load may be driven by using both outputs simultaneously, for example, the ends of a center tapped transformer with the center tap tied either to ground or an appropriate common mode voltage. Also, not only is the demand for supply current constant, but the sum of the currents $I_{OUT}$ and $\overline{I_{OUT}}$ is the same for either logic input state. This is an advantage in driving active circuitry which cannot respond quickly to fast changes in current demand. Secondly, the cell possesses high output voltage compliance, which means that the output may be used over a wide range of output voltages, and yet maintaining the same value of current. This defines a true current output. This results from the high output impedance of the transistor cell of the present invention. In the present invention the allowable output voltage may swing between +18 volts and −10 volts, with typically less than a 0.1% current change. Thirdly, the transistor current switch of the present invention has low propagation delay and settling time at low current levels. For example, the current cell of the present invention will switch steering currents over the range of 4 milliamps down to slightly less than 1 microampere all with a propagation delay of less than 40 nanoseconds. At a current level of 100 nanoamperes, propagation delay is still under 150 nanoseconds.

While the transistor switching cells of the present invention have been described for use with reference to an electrical ladder of the type found in digital to analog converters, such use is merely exemplary, and the transistor switching cell may have many diverse applications.

In the transistor switching cell of the present invention, it will be realized that transistor polarity types may be changed, so long as symmetry is preserved between left and right branches.

I claim:

1. A differential input, differential output current switch comprising,
   a balanced two branch transistor input means for (a) receiving switch current, said two branch transistor input means comprising a left branch and a right branch, each branch having an input transistor with a control electrode, an output electrode and a common electrode, each branch having a first node in common to which said common electrode is connected and said switch current is supplied, one of said branches receiving a digital logic signal at the control electrode thereof and the other of said branches receiving a threshold adjustment voltage at the control electrode thereof, and for (b) switching switch current alternately between one of said two branches and the other, in response to said digital logic signal,
   a balanced two branch transistor output means for (a) receiving a controlled amount of steering current supplied from a connected source, said two branch transistor output means comprising a left branch and a right branch, each branch having an output transistor with an output electrode for connection to a terminal of a load, having a common electrode connected to a second common node to which said steering current is supplied, and having a control electrode connected to an output electrode of an input transistor of a corresponding branch of said balanced transistor input means, and for (b) communicating steering current to said load associated with each branch of the output means depending upon the existence of switch current in the corresponding branch of the input means,
   a switch current bias circuit means connected to said first node for supplying said switch current in regulated amounts to said first node and,
   a bias circuit means communicating with the output electrode of each of said input transistors for compensating transients upon switching current between circuit branches.

2. The apparatus of claim 1 wherein said balanced two branch transistor input means includes a threshold bias circuit means connected to the control electrode of said other branch for generating a constant voltage as a threshold adjustment signal defining a threshold for said logic input signal.

3. The apparatus of claim 1 wherein each output electrode of each output transistor is connected to a load.

4. The apparatus of claim 1 wherein each output electrode of each output transistor is connected to a common balanced load.

5. The apparatus of claim 1 wherein the control electrode of the input transistor receiving said digital logic signal is connected to an input resistor means for filtering transients.

6. A differential input, differential output current cell comprising,
   a. a pair of matched level shifting input transistors arranged symmetrically in opposite left and right branches and each level shifting transistor having,
      1. a common electrode joined at a first node, said first node connected to a first bias circuit means for supplying switch current,
      2. a control electrode and
      3. an output electrode for handling switch current in each respective circuit branch supplied from a source, one of said control electrodes receiving a digital input signal, the other of said control electrodes receiving a threshold adjustment voltage from a connected second bias circuit means, said digital input signal having at least two discrete states including a low state for turning on one of said level shifting transistors and the other transistor off and a high state for turning off the one transistor and turning on the other transistor, said second bias circuit means for generating a constant voltage threshold at a low impedence, said constant voltage threshold having a voltage between said low state and said high state, b. a pair of matched output transistors each respective transistor symmetrically connected in said opposite left and right branches, each output transistor having, 1. a common electrode joined at a second node, said second node connected to receive steering current from one of said output transistors,
2. a control electrode connected to a respective output electrode of a level shifting input transistor for receiving switch current therefrom and initiating transfer of steering current from one circuit branch to another in response to a change in switch current between branches,
3. an output electrode connected to a respective load for communicating steering current therewith, c. a pair of matched voltage dropping means arranged symmetrically in said opposite left and right branches, one end of said voltage dropping means connected to a respective control electrode of an output transistor, the other end mutually connected to a third bias circuit means, d. a third bias circuit means connected to said voltage dropping means for compensating transients in transfering current between left and right circuit branches whereby a logic input signal specifies one of said circuit branches wherein switch current switches steering current from one output electrode of said output transistors to the other.

7. The apparatus of claim 6 wherein said control electrode of the level shifting transistor receiving said digital input signal is connected to an input resistor means for filtering transients.

* * * * *